US009167680B2

(12) United States Patent
Yamazawa et al.

(10) Patent No.: US 9,167,680 B2
(45) Date of Patent: Oct. 20, 2015

(54) PLASMA PROCESSING APPARATUS, PLASMA GENERATING APPARATUS, ANTENNA STRUCTURE AND PLASMA GENERATING METHOD

(71) Applicant: TOKYO ELECTRON LIMITED, Tokyo (JP)

(72) Inventors: Yohei Yamazawa, Yamanashi (JP); Takafumi Kimura, Yamanashi (JP); Chishio Koshimizu, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 237 days.

(21) Appl. No.: 14/011,860

(22) Filed: Aug. 28, 2013

(65) Prior Publication Data
US 2014/0062296 A1    Mar. 6, 2014

Related U.S. Application Data

(60) Provisional application No. 61/700,024, filed on Sep. 12, 2012.

(30) Foreign Application Priority Data

Aug. 31, 2012 (JP) ................................. 2012-191788

(51) Int. Cl.
H01Q 1/26 (2006.01)
H01J 7/24 (2006.01)
H05H 1/46 (2006.01)
H01J 37/32 (2006.01)

(52) U.S. Cl.
CPC ................ *H05H 1/46* (2013.01); *H01J 37/321* (2013.01); *H01J 37/3211* (2013.01); *H01J 37/32119* (2013.01); *H05H 2001/4667* (2013.01)

(58) Field of Classification Search
CPC .. H05H 1/46; H01J 37/32715; H01J 37/3211; H01J 37/32137; H01J 37/32091; H01J 37/32825; H01J 37/32935
USPC ............. 315/34, 32, 111.21, 111.41, 111.51, 315/111.71; 156/345.48; 118/723 I, 723 IR
See application file for complete search history.

(56) References Cited

U.S. PATENT DOCUMENTS 6,028,395 A * 2/2000 Holland et al. .......... 315/111.51
6,331,754 B1 * 12/2001 Satoyoshi et al. ....... 315/111.51
(Continued)

FOREIGN PATENT DOCUMENTS

JP        2011-29584 A      2/2011
JP        2011-103346 A     5/2011

*Primary Examiner* — Lincoln Donovan
*Assistant Examiner* — Thomas Skibinski
(74) *Attorney, Agent, or Firm* — Rothwell, Figg, Ernst & Manbeck, P.C.

(57) ABSTRACT

A plasma processing apparatus includes: a mounting table, disposed in a processing chamber, configured to mount thereon the substrate; an inductively coupled antenna disposed outside the processing chamber to be opposite to the mounting table, the inductively coupled antenna being connected to a high frequency power supply; and a window member forming a wall of the processing chamber which faces the inductively coupled antenna. The window member includes a plurality of conductive windows made of a conductive material, and dielectric portions disposed between the conductive windows. The inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

19 Claims, 9 Drawing Sheets

(56) References Cited

U.S. PATENT DOCUMENTS 6,447,635 B1 * 9/2002 Ra ........................... 156/345.48
2002/0002947 A1 * 1/2002 Satoyoshi et al. .......... 118/723 I
2010/0175831 A1 * 7/2010 Sasaki ...................... 156/345.48
2011/0108194 A1 5/2011 Yoshioka et al.

* cited by examiner

○ : CURRENT FLOWS THROUGH ICP ANTENNA AND CONDUCTIVE WINDOW

△ : CURRENT FLOWS ONLY THROUGH ICP ANTENNA

□ : CURRENT FLOWS ONLY THROUGH CONDUCTIVE WINDOW

PLASMA PROCESSING APPARATUS, PLASMA GENERATING APPARATUS, ANTENNA STRUCTURE AND PLASMA GENERATING METHOD

CROSS-REFERENCE TO RELATED APPLICATIONS

This application claims priority to Japanese Patent Application No. 2012-191788 filed on Aug. 31, 2012, and U.S. Provisional Patent Application No. 61/700,024 filed on Sep. 12, 2012, the entire contents of which are incorporated herein by reference.

FIELD OF THE INVENTION

The present invention relates to a plasma processing apparatus for generating a plasma by using an ICP (inductively coupled plasma) antenna, a plasma generating apparatus, an antenna structure and a plasma generating method.

BACKGROUND OF THE INVENTION

In a plasma processing apparatus including a chamber and an ICP (inductively coupled plasma) antenna disposed outside the chamber, a ceiling portion of the chamber which faces the ICP antenna is configured as a window member (dielectric window) made of a dielectric material, e.g., quartz or the like. The ICP antenna is connected to a high frequency power supply, and magnetic force lines are generated at the ICP antenna by a high frequency current supplied to the ICP antenna. The generated magnetic force lines are transmitted through the dielectric window, thereby generating a magnetic field in the chamber along the ICP antenna. If the magnetic field is temporally changed, an induced electric field is generated. Electrons accelerated by the generated induced electric field collide with molecules or atoms of a processing gas introduced into the chamber, thereby generating a plasma. Since the induced electric field is generated along the ICP antenna, the plasma is also generated in the chamber along the ICP antenna.

Here, the dielectric window partitions the inside of the chamber which is a depressurized environment and the outside of the chamber which is an atmospheric environment, and therefore, it is required to have a thickness that ensures stiffness enough to endure the pressure difference. Further, a substrate to be subjected to plasma processing while being accommodated in the chamber, e.g., a semiconductor wafer or a glass substrate for use in FPD (flat panel display), is expected to be further scaled up, so that the dielectric window opposite to the substrate also needs to be scaled up. At this time, if the thickness of the dielectric window is increased to ensure stiffness required in the case of scaling up the dielectric window, the distance between the ICP antenna and the substrate is increased, which results in deterioration of efficiency. Moreover, the increase in the weight of the dielectric window leads to the increase in the apparatus weight or the increase in costs.

Accordingly, there is suggested a configuration in which a ceiling portion of a chamber is configured as a conductive window made of a material of low cost and high stiffness, e.g., metal (see, e.g., Japanese Patent Application Publication No. 2011-029584.) In the conductive window, the magnetic force lines are shielded by the metal, so that slits penetrating through the conductive window are provided and the magnetic force lines pass through the slits. However, the number or the size of the slits provided at the conductive window is restricted. Therefore, in the case of employing the conductive window, there occurs a problem that the transmission efficiency of the magnetic force lines deteriorates and as a result, the plasma generating efficiency deteriorates.

Meanwhile, there is suggested a configuration in which a ring-shaped conductor is disposed near an inductive antenna including an inner coil and an outer coil along the inductive antenna (see Japanese Patent Application Publication No. 2011-103346.) Here, the mutual inductance is controlled at circumferential positions between the ring-shaped conductor and the induction antenna and between the ring-shaped conductor and the plasma by changing the radius of the ring-shaped conductor from the center of the apparatus and the cross-sectional shape of the ring-shaped conductor depending on the circumferential angle of the coils. Accordingly, the coil current varied depending on the circumference of the coils of the induction antenna can be compensated, and uniformity of a current on the generated plasma in the circumferential direction can be improved. With such a configuration, the deterioration of the plasma generating efficiency can be suppressed.

However, the aforementioned conventional configuration cannot sufficiently improve the plasma generating efficiency, and a higher efficiency is required.

SUMMARY OF THE INVENTION

In view of the above, the present invention provides a plasma processing apparatus, a plasma generating apparatus, an antenna structure and a plasma generating method which can improve plasma generating efficiency.

In accordance with a first aspect of the present invention, there is provided a plasma processing apparatus including: a processing chamber configured to accommodate therein a substrate; a mounting table, disposed in the processing chamber, configured to mount thereon the substrate; an inductively coupled antenna disposed outside the processing chamber to be opposite to the mounting table, the inductively coupled antenna being connected to a high frequency power supply; and a window member disposed between the mounting table and the inductively coupled antenna, the window member forming a wall of the processing chamber which faces the inductively coupled antenna, wherein the window member includes a plurality of conductive windows made of a conductive material, and dielectric portions disposed between the conductive windows; and the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

In accordance with a second aspect of the present invention, there is provided a plasma generating apparatus for generating a plasma in a depressurized chamber, including: an inductively coupled antenna disposed outside the depressurized chamber, the inductively coupled antenna being connected to a high frequency power supply; and a window member disposed between the inductively coupled antenna and a plasma generated in the depressurized chamber, the window member forming a wall of the depressurized chamber, wherein the window member includes a plurality of conductive windows made of a conductive material, and dielectric portions disposed between the conductive windows; and the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

In accordance with a third aspect of the present invention, there is provided an antenna structure including: an inductively coupled antenna to be connected to a high frequency power supply; and a window member disposed between the inductively coupled antenna and a plasma generated by the inductively coupled antenna, wherein the window member includes a plurality of conductive windows made of a conductive material, and dielectric portions disposed between the conductive windows, and the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

In accordance with a fourth aspect of the present invention, there is provided a plasma generating method using an antenna structure including an inductively coupled antenna connected to a high frequency power supply, and a window member provided between the inductively coupled antenna and a plasma generated by the inductively coupled antenna, wherein the window member has a plurality of conductive windows made of a conductive material and dielectric portions disposed between the conductive windows, the method including: extending the inductively coupled antenna on the window member in a predetermined direction and electrically connecting the inductively coupled antenna to one of the conductive windows; electrically connecting from the one of the conductive windows to the other conductive windows sequentially by conductors in the same direction as an extension direction of the inductively coupled antenna; and generating a plasma by making a high frequency current flow through the inductively coupled antenna and the conductive windows.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
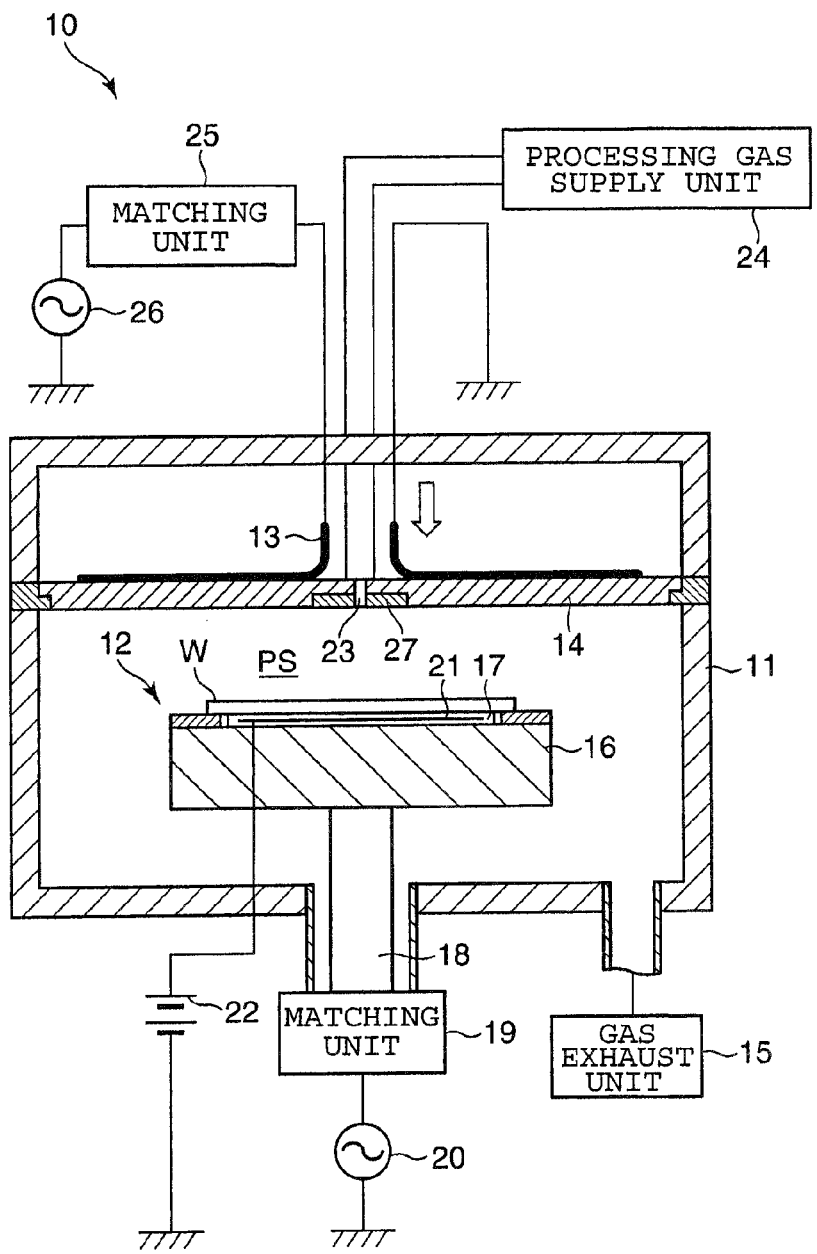
FIG. 1 is a cross sectional view showing a schematic configuration of a plasma processing apparatus in accordance with an embodiment of the present invention.

Hereinafter, embodiments of the present invention will be described with reference to the accompanying drawings. First, a plasma processing apparatus in accordance with an embodiment of the present invention will be described. FIG. 1 is a cross sectional view showing a schematic diagram of a plasma processing apparatus in accordance with the embodiment of the present invention.

A plasma processing apparatus (plasma generating apparatus) 10 includes: a chamber 11 (processing chamber, depressurized chamber) accommodating therein, e.g., a semiconductor wafer (hereinafter, referred to as "wafer") W; a mounting table 12, disposed at a bottom portion of the chamber 11, for mounting thereon a wafer W; an inductively coupled antenna (hereinafter, referred to as "ICP antenna") 13 disposed outside the chamber 11 to be opposite to the mounting table 12 in the chamber 11; and a window member 14, forming a ceiling portion of the chamber 11, disposed between the mounting table 12 and the ICP antenna 13.

The chamber 11 has a substantially cylindrical shape, and a size (diameter×height) thereof is properly set in accordance with an outer diameter of a wafer W mounted on the mounting table 12. A gas exhaust port is provided at a bottom surface of the chamber 11, and a gas exhaust unit 15 is connected to the gas exhaust port. The gas exhaust unit 15 vacuum-evacuates the chamber 11 to set the inside of the chamber 11 to a depressurized environment.

Meanwhile, the outside of the chamber 11 is an atmospheric pressure environment, and the window member 14 serves as a wall for partitioning the inside and the outside of the chamber 11. The window member 14 has a plurality of conductive windows made of a conductive material and dielectric portions disposed between the plurality of conductive windows. The entire window member 14 has a size enough to cover at least the entire surface of the wafer W mounted on the mounting table 12. The detailed configuration of the window member 14 will be described with reference to FIG. 2.

The mounting table 12 has a circular plate-shaped susceptor 16 serving as a base and an electrostatic chuck 17 formed on the top surface of the susceptor 16. The susceptor 16 is a conductive member and connected to a high frequency power supply 20 through a power supply rod 18 and a matching unit 19. The high frequency power supply 20 supplies a high frequency power having a relatively low frequency of, e.g., 13.56 MHz or less, to the susceptor 16 and generates a bias potential at the susceptor 16. Accordingly, ions in a plasma generated in a processing space PS between the mounting table 12 and the window member are attracted to the wafer W mounted on the mounting table 12.

The electrostatic chuck 17 is a dielectric member and has therein an electrode plate 21 that is a conductive member. A DC power supply 22 is connected to the electrode plate 21, and the electrostatic chuck 17 electrostatically attracts and holds the wafer W onto the mounting table 12 by an electrostatic force generated by a DC voltage applied from the DC power supply 22 to the electrode plate 21.

A processing gas inlet port 23 is formed at a beam unit 27 for supporting the window member 14, and a processing gas supplied from a processing gas supply unit 24 is introduced into the chamber 11. The ICP antenna 13 is formed of a ring-shaped conducting wire or conductive plate disposed along the top surface of the window member 14 and is connected to a high frequency power supply 26 via a matching unit 25.

In the plasma processing apparatus 10, a high frequency current flows through the ICP antenna 13 and generates magnetic force lines at the ICP antenna 13. When the window member is made of a dielectric material as in the conventional case, the generated magnetic force lines are transmitted through the window member. However, when the window member 14 is made of a conductive material as in the present embodiment, the magnetic force lines pass through the slits formed in the window member 14 or the gaps formed between the conductive windows and generate a magnetic field in the chamber 11. Due to the temporal change of the magnetic field in the chamber 11, an induced electric field is generated. The electrons accelerated by the induced electric field collide with molecules or atoms of the processing gas introduced into the chamber 11, thereby generating a plasma. The ions in the generated plasma are attracted to the wafer W by the bias potential of the susceptor 16, and the radicals in the plasma move to reach the wafer, so that the plasma processing, e.g., physical etching or chemical etching, is performed on the wafer W.

Figure 2:
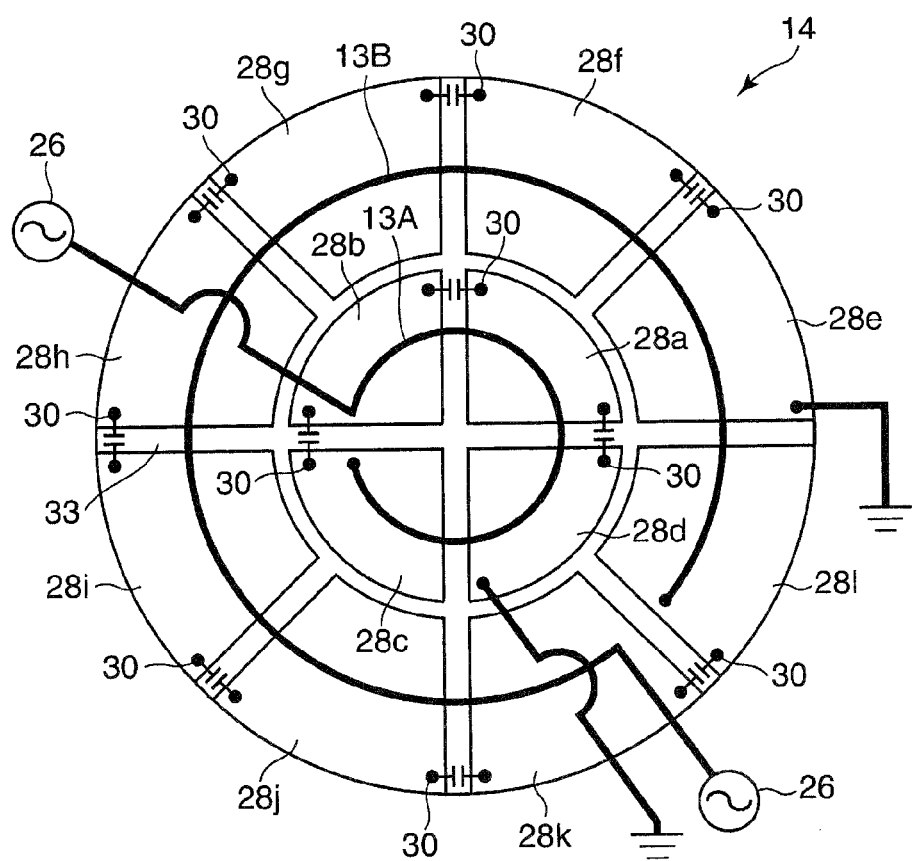
FIG. 2 is a top view of a window member and an ICP antenna of FIG. 1 seen from a direction of a white arrow in FIG. 1.

FIG. 2 is a top view of the window member 14 and the ICP antenna 13 of FIG. 1, seen from a direction of the white arrow in FIG. 1. Although a single ICP antenna 13 is shown in FIG. 1, FIG. 2 illustrates that two ICP antennas 13A and 13B are connected to the high frequency power 26 via the matching unit 25. However, the illustration of the matching unit 25 is omitted in FIG. 2.

The window member 14 forms an antenna structure together with the ICP antenna 13. In the present embodiment, the window member 14 includes: twelve conductive windows, i.e., four conductive windows 28a to 28d disposed in a circular shape at a circular plate-shaped central portion as shown in the top view of FIG. 2 and eight conductive windows 28e to 28l disposed in a ring shape at a circular plate-shaped outer peripheral portion as shown in the top view of FIG. 2; and dielectric portions 33 made of a dielectric material (insulating material) disposed between the conductive windows 28a to 28l. Therefore, the electrical conduction between the conductive windows 28a to 28l by direct contact does not occur. Further, the conductive windows 28a to 28l are symmetrically arranged with respect to the center of the window member 14. In the following description, the term "conductive window 28" is used in the case of not indicating a specific conductive window among the conductive windows 28a to 28l.

The conductive windows 28a to 28l are made of metal, e.g., Al or the like. However, the conductive windows are not limited thereto and may be made of a semiconductor such as Si or the like. The dielectric portions 33 may be made of, e.g., quartz ($SiO_2$), alumina, heat resistant resin or the like.

Meanwhile, in the window member 14, predetermined conductive windows 28 adjacent to each other are electrically connected by a conducting wire 30 with a capacitor. The conducting wire 30 with a capacitor serves as a conductor and is formed by arranging a capacitor between metal wires. As for the capacitor of the conducting wire 30, a capacitance-variable capacitor or a capacitance-fixed capacitor is used.

In the window member 14 shown in FIG. 2, predetermined conductive windows 28 adjacent to each other are connected by the conducting wire 30 with a capacitor. However, a part or all of the conducting wires 30 may be replaced by a different conductor, e.g., a metal board or a metal wire having no capacitor (hereinafter, simply referred to as "simple conducting wire"). In the case of replacing a part of the conducting wires 30 by simple conducting wires, it is preferable that the conducting wires 30 are symmetrically arranged with respect to the center of the window member 14 and the simple conducting wires are also symmetrically arranged with respect to the center of the window member 14. Accordingly, the symmetry (uniformity) of the plasma distribution can be enhanced, and the plasma processing can be uniformly performed on the wafer W.

In the present embodiment, the form of the electrical connections between the conductive windows 28 by the conducting wires 30 is closely related to the form of the arrangement of the ICP antenna 13.

In other words, an ICP antenna 13A connected to the high frequency power supply 26 is put on the conductive window 28b of the window member 14, extended to form a circle on the conductive windows 28b, 28a, 28d and 28c about the center of window member 14 in a clockwise direction, and then electrically connected to the conductive window 28c. Further, the conducting wires 30 sequentially connect between the conductive windows 28c and 28b, between the conductive windows 28b and 28a, and between the conductive windows 28a and 28d such that the conductive windows 28a to 28d are connected to one another in the same direction as the extension direction of the ICP antenna 13A. However, the conductive windows 28c and 28d are not electrically connected to each other directly. The conductive window 28d is connected to earth. As long as the conductive windows 28a to 28d are electrically connected to one another in the same direction as the extension direction of the ICP antenna 13A, the ICP antenna 13A may be put on the dielectric portion 33 of the window member 14 instead of the conductive window 28.

In the same manner, another ICP antenna 13B connected to the high frequency power supply 26 is put on the conductive window 28k of the window member 14, extended to form a circle on the conductive windows 28j, 28i, 28h, 28g, 28f, 28e and 28l about the center of window member 14 in a clockwise direction, and then electrically connected to the conductive window 28l. Further, the conducting wires 30 sequentially connect between the conductive windows 28l and 28k, between the conductive windows 28k and 28j, between the conductive windows 28j and 28i, between the conductive windows 28i and 28h, between the conductive windows 28h and 28g, between the conductive windows 28g and 28f, and between the conductive windows 28f and 28e such that the conductive windows 28e to 28l are connected to one another in the same direction as the extension direction of the ICP antenna 13B. However, the conductive windows 28e and 28l are not electrically connected to each other directly. The conductive window 28e is connected to earth.

With such a configuration, the current substantially equal to the high frequency current flowing through the ICP antennas 13A and 13B flows through the conductive windows 28a to 28d and 28e to 28l. Therefore, the conductive windows 28a to 28d and 28e to 28l serve as a sub-antenna for generating a plasma to supplement the functions of the ICP antennas 13A and 13B. Accordingly, the conductive windows 28a to 28l assist the plasma excitation of the ICP antenna 13, which can result in improvement of the plasma generating efficiency.

Here, in order to assist the plasma excitation of the ICP antenna 13A by using the conductive windows 28a to 28d, it is required to connect the ICP antenna 13A to one of the conductive windows 28a to 28d, electrically connect the conductive windows to one another such that the high frequency current can flow in the same direction as the extension direction of the ICP antenna 13A, and ground the conductive window positioned at the terminal of the electrical connection. This is because, when the conductive windows 28a to 28d are connected in the opposite direction to the extension direction of the ICP antenna 13A, the direction of the auxiliary magnetic field generated by the conductive windows 28a to 28d becomes opposite to the direction of the main magnetic field generated by the ICP antenna 13A, and thus the main magnetic field and the auxiliary magnetic field are cancelled by each other. As a consequence, the induced electric field generated in the processing space PS is weakened, and the plasma generating efficiency deteriorates.

For the same reason, in order to assist the plasma excitation of the ICP antenna 13B by using the conductive windows 28e to 28l, it is required to connect the ICP antenna 13B to one of the conductive windows 28e to 28l, electrically connect the conductive windows to one another such that the high frequency current can flow in the same direction as the extension direction of the ICP antenna 13B, and ground the conductive window positioned at the terminal of the electrical connection. Accordingly, the direction of the main magnetic field generated by the ICP antenna 13B and the direction of the auxiliary magnetic field generated by the conductive windows 28e to 28l become the same.

Figure 3A:
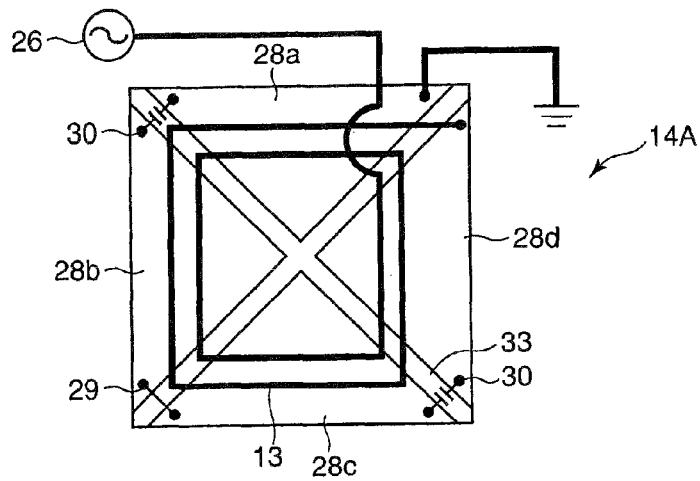
FIG. 3A shows a window member having another configuration for examining plasma generating efficiency.
Figure 3B:
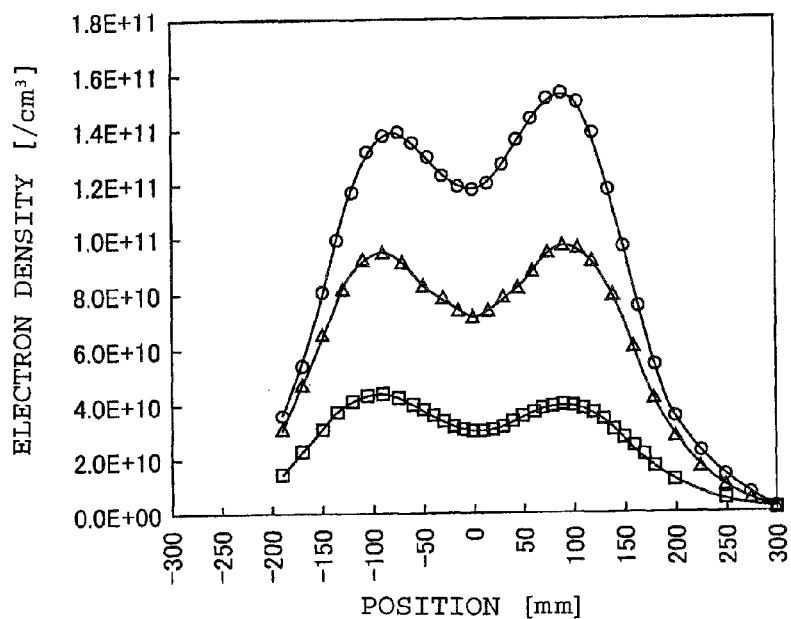
FIG. 3B is a graph showing a result of examining a difference in the plasma generating efficiency due to a difference in high frequency current application methods.

FIG. 3A shows a window member 14A having another configuration for examining the plasma generating efficiency. FIG. 3B is a graph showing a difference in the plasma generating efficiency due to a difference in high frequency current application methods in the window member 14A. Here, as shown in FIG. 3A, a two-turn coil whose average side length is about 240 mm is provided as the ICP antenna 13, on the window member 14A in which dielectric portions 33 made of quartz and having a width of about 10 mm are disposed between the conductive windows 28a to 28d formed by diagonally dividing a square having a side length of about 280 mm into four triangular parts.

The ICP antenna 13 is extended in a clockwise direction in FIG. 3A, and the terminal thereof is connected to the conductive window 28d. The conductive windows 28a to 28d are electrically connected to one another in the clockwise direction such that the high frequency current can flow through the conductive windows 28a to 28d in the same direction as the high frequency current flowing through the ICP antenna 13. The conductive windows 28d and 28c are electrically connected to each other by the conducting wire 30 with a capacitor; the conductive windows 28c and 28b are electrically connected to each other by the simple conducting wire 29; and the conductive windows 28b and 28a are electrically connected to each other by the conducting wire 30 with a capacitor. The conductive windows 28a and 28d are not electrically connected directly, and the conductive window 28a is connected to earth.

FIG. 3B shows the result of measuring electron density distribution using a plasma absorption probe in the case of generating a plasma in a processing space PS while setting a pressure in the chamber 11 to 20 mTorr (≈2.67 Pa), a flow rate of gas supplied to the chamber 11 to Ar/$O_2$=300/30 sccm, a power to 1000 W and changing an electrode to which the high frequency current (frequency: 13.56 MHz) is applied. The position of zero in the horizontal axis corresponds to the position directly below the center of the window member 14A.

In the plasma processing apparatus 10 shown in FIG. 1, the vacuum atmosphere and the atmospheric atmosphere need to be partitioned by the window member 14A. Here, the vacuum atmosphere and the atmospheric atmosphere are partitioned by a quartz plate having a thickness of 30 mm, and the examination is performed by applying a high frequency current to the window member 14A provided at the atmospheric atmosphere side on the quartz plate. The absolute value of the plasma generating efficiency may be slightly different between the case where the vacuum atmosphere and the atmospheric atmosphere are partitioned by the window member 14A and the case where the vacuum atmosphere and the atmospheric atmosphere are partitioned by the quartz plate. However, the order of the current application conditions with respect to the plasma generating efficiency is not changed in the two cases.

In FIG. 3B, a plot indicated by "circle (O)" indicates electron density distribution obtained when the high frequency current is made to flow through the conductive windows 28a to 28d and the ICP antenna 13; a plot indicated by "triangle (Δ)" indicates electron density distribution obtained when the high frequency current is made to flow only through the ICP antenna 13; and a plot indicated by "rectangle (□)" indicates electron density distribution obtained when the high frequency current is made to flow only through the conductive windows 28a to 28d. As clearly seen from FIG. 3B, when the high frequency current flows through the ICP antenna 13 and the conductive windows 28a to 28d, the electron density is higher compared to when the high frequency current flows only through the ICP antenna 13 and when the high frequency current flows only through the conductive windows 28a to 28d, so that it is confirmed that the plasma generating efficiency has been improved.

As described above, in the present embodiment, the ICP antenna 13 is connected to one of the conductive windows 28; the conductive windows 28 are electrically connected to one another such that the high frequency current can flow in the same direction as the extension direction of the ICP antenna 13; and the conductive window positioned at the terminal of the electrical connection is grounded. Accordingly, the electrically connected conductive windows 28 serve as a subantenna for assisting the plasma generation by the ICP antenna 13, which can result in improvement of the plasma generating efficiency.

Figure 4:
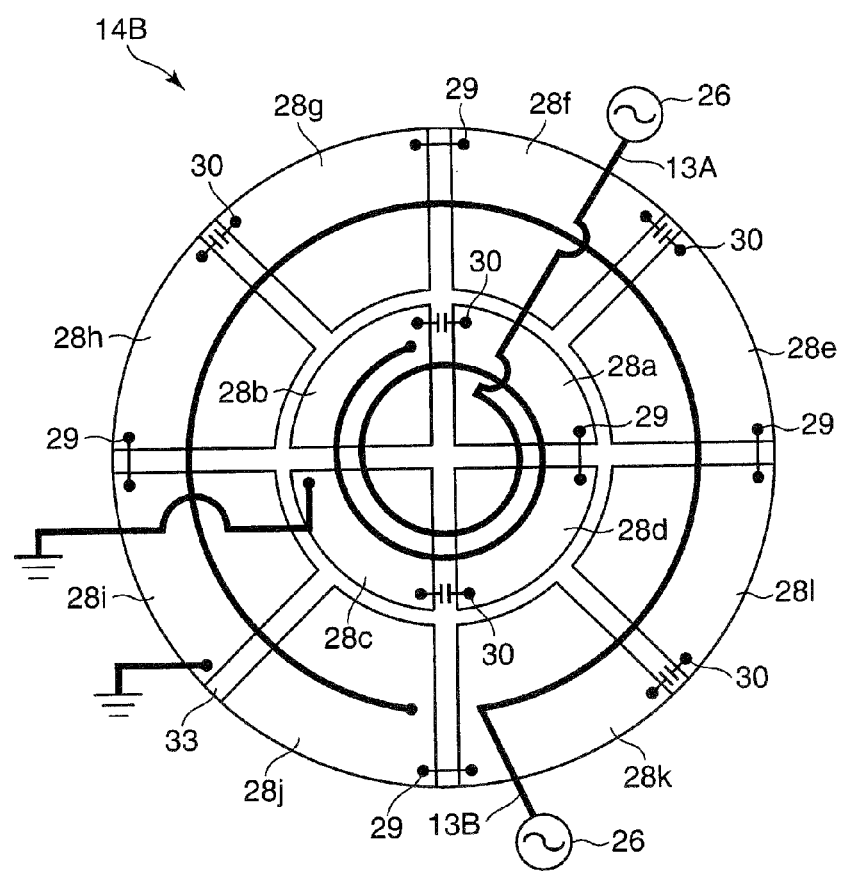
FIG. 4 is a top view showing a structure of a window member in accordance with another embodiment of the present invention.

Hereinafter, a modification of the window member 14 shown in FIG. 2 will be described. FIG. 4 is a top view showing a structure of a window member 14B in accordance with another embodiment of the present invention, which has been depicted from the same viewpoint as FIG. 2. The window member 14B is different from the window member 14 of FIG. 2 in that the ICP antenna 13A is arranged in a clockwise direction from the high frequency power supply 26 side to the earth connection side while the ICP antenna 13B is arranged in a counterclockwise direction from the high frequency power supply 26 side to the earth connection side.

At the central portion of the window member 14B, the ICP antenna 13A connected to the high frequency power supply 26 is put on the conductive window 28a, extended to form a circle in two turns in the clockwise direction about the center of the window member 14B, and then electrically connected to the conductive window 28b. Moreover, the conductive windows 28b and 28a are connected to each other by the conducting wire 30 with a capacitor; the conductive windows 28a and 28d are connected to each other by the simple conducting wire 29; and the conductive windows 28d and 28c are connected to each other by the conducting wire 30 with a capacitor so that the conductive windows 28a to 28d are electrically connected in the clockwise direction same as the extension direction of the ICP antenna 13A. The conductive windows 28c and 28b are not electrically connected to each other directly, and the conductive window 28c is connected to earth.

Meanwhile, another ICP antenna 13B connected to the high frequency power supply 26 is put on the conductive window 28k of the window member 14B, extended to form a circle on the conductive windows 28l, 28e, 28f, 28g, 28h, 28i and 28j in the counterclockwise direction about the center of the window member 14B, and then electrically connected to the conductive window 28j. Further, the conductive windows 28j and 28k are connected to each other by the simple conducting wire 29; the conductive windows 28k and 28l are connected to each other by the conducting wire 30 with a capacitor; the conductive windows 28l and 28e are connected to each other by the simple conducting wire 29; the conductive windows 28e and 28f are connected to each other by the conducting wire 30 with a capacitor; the conductive windows 28f and 28g are connected to each other by the simple conducting wire 29; the conductive windows 28g and 28h are connected to each other by the conducting wire 30 with a capacitor; and the conductive windows 28h and 28i are connected to each other by the simple conducting wire 29 so that the conductive windows 28e to 28l are connected in the counterclockwise direction same as the extension direction of the ICP antenna 13B. The conductive windows 28i and 28j are not electrically connected to each other directly, and the conductive window 28i is connected to earth.

In this way, when the extension direction of one ICP antenna is the same as the connection direction of the conductive windows below the very ICP antenna, the extension directions of a plurality of ICP antennas in a single window member may be different. In the window member 14B, the simple conducting wires 29 and the conducting wires 30 are symmetrically arranged with respect to the center of the window member 14B, so that the uniformity of the plasma generated in the processing space PS can be improved.

Figure 5:
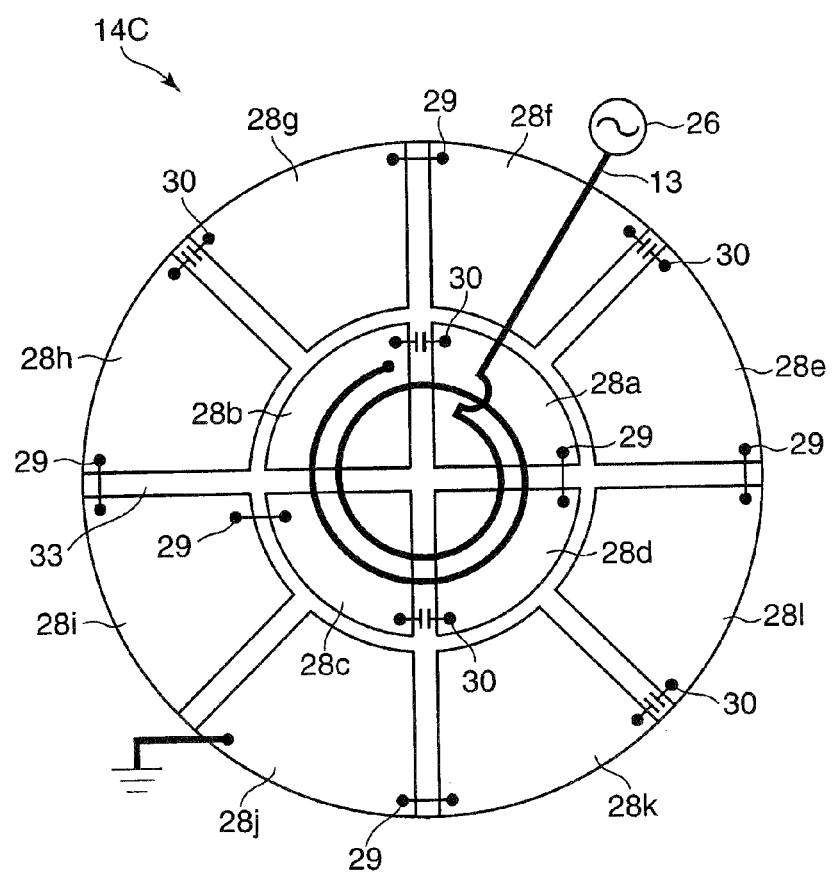
FIG. 5 is a top view showing a structure of a window member in accordance with still another embodiment of the present invention.

FIG. 5 is a top view showing a structure of the window member 14C in accordance with still another embodiment of the present invention, which has been depicted from the same viewpoint as FIG. 2. The window member 14C is different from the window member 14 of FIG. 2 in that the conductive windows 28e to 28l are used as a sub-antenna without installing the ICP antenna on the conductive windows 28e to 28l provided at the outer peripheral portion.

The configuration at the central portion (the ICP antenna 13 and the conductive windows 28a to 28d) of the window member 14C is the same as that of the window member 14B shown in FIG. 4, so that the description thereof will be omitted. Although the conductive window 28c in the window member 14B is connected to earth, the conductive window 28c in the window member 14C is electrically connected to the conductive window 28i. Further, the conductive windows 28i, 28h, 28g, 28f, 28e, 28l, 28k and 28j are electrically connected in that order in the same direction as the extension direction of the ICP antenna 13 by the simple conducting wire 29 or the conducting wire 30 with a capacitor. The conductive window 28j is connected to earth.

With the configuration of the window member 14C, the conductive windows 28e to 28l serve as a sub-antenna, so that the plasma generating efficiency can be improved.

While the embodiments of the present invention have been described, the present invention is not limited to the above-described embodiments. For example, the arrangement of the ICP antenna and the electrical connection of the conductive windows may be variously modified by combining the characteristics of the aforementioned window members 14, 14B and 14C. In the window members 14, 14B and 14C, the conductive windows are provided at two areas, i.e., the central area and the outer peripheral area positioned at the outer side of the central area. However, the conductive windows may be provided at three or more areas, i.e., a central area, an intermediate area positioned at an outer side of the central area, an outer peripheral area positioned at an outer side of the intermediate area, or the like.

In the embodiment shown in FIG. 2, the conducting wires 30 or the simple conducting wires 29 are installed near the outer peripheral side of each of the conductive windows 28a to 28l. However, the installation position is not limited thereto. The plasma concentration (electron concentration) in the processing space PS tends to be higher under the position where the conducting wires 30 or the simple conducting wires 29 are installed, so that the installation positions of the conducting wires 30 or the simple conducting wires 29 in the window member 14 may be adjusted to correspond to the positions where high plasma concentration is required.

Although the above embodiments have employed the configuration in which the wafer W is subjected to the plasma processing, the substrate to be processed is not limited thereto and may also be a glass substrate such as FPD (Flat Panel Display) or the like. In that case, the shape of the window member or the chamber of the plasma processing apparatus may be properly set in accordance with the shape of the glass substrate.

Figure 6:
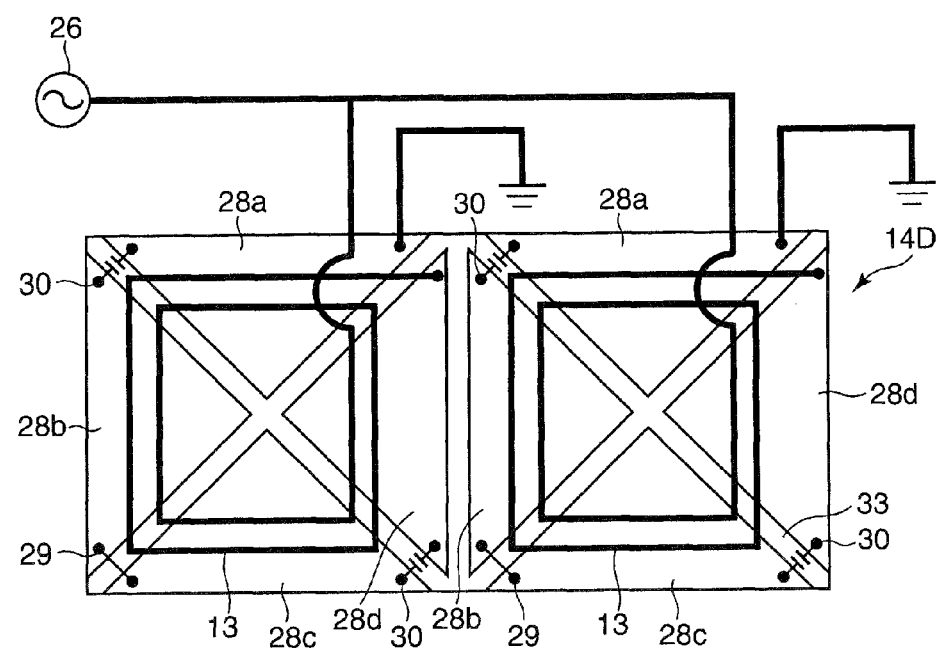
FIG. 6 is a top view showing a structure of a window member in accordance with still another embodiment of the present invention.

FIG. 6 is a top view showing a structure of a window member 14D used in the plasma processing apparatus for processing a rectangular glass substrate, which has been depicted from the same viewpoint as FIG. 2. The window member 14D is formed by arranging two window members 14A of FIG. 3A side by side. However, a larger number of window members 14A may be arranged in accordance with the shape of the glass substrate, or the ICP antenna 13 may be extended to form a circular arc with respect to the window member 14D.

In the window members 14 and 14A to 14D described in the above embodiments, the final one among the conductive windows 28a to 28l electrically connected to the ICP antenna 13, 13A or 13B, is directly connected to earth. However, the present invention is not limited thereto.

Figure 7:
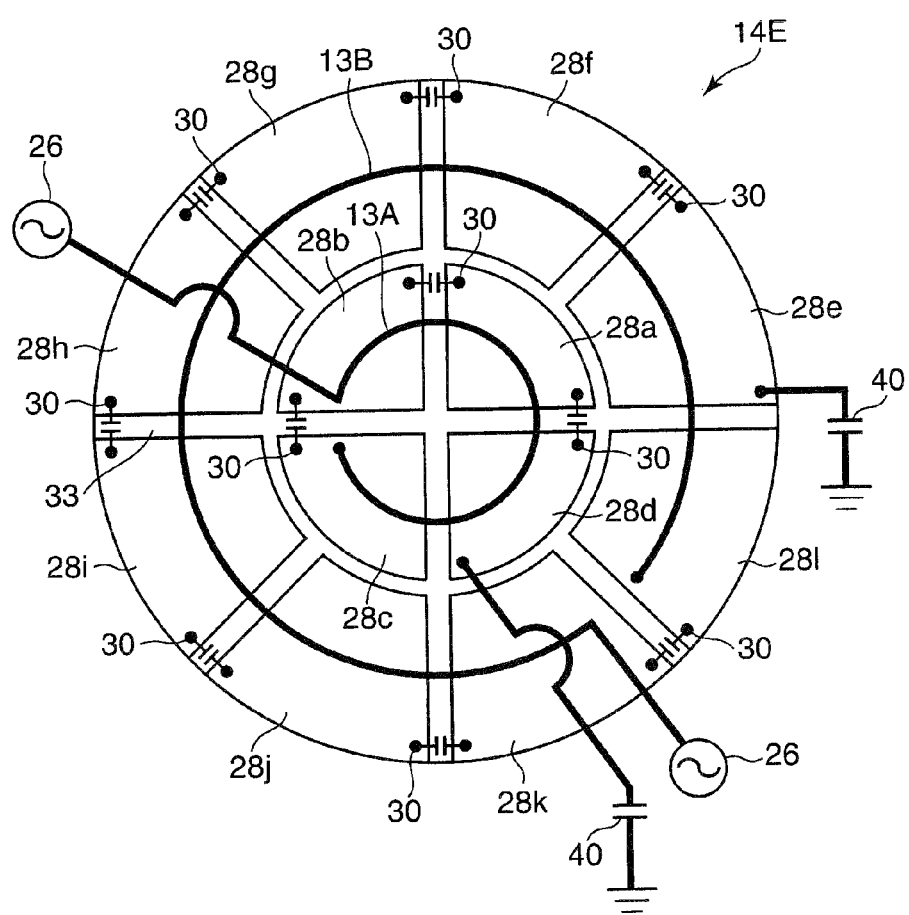
FIG. 7 is a top view showing a structure of a window member in accordance with still another embodiment of the present invention.
Figure 8:
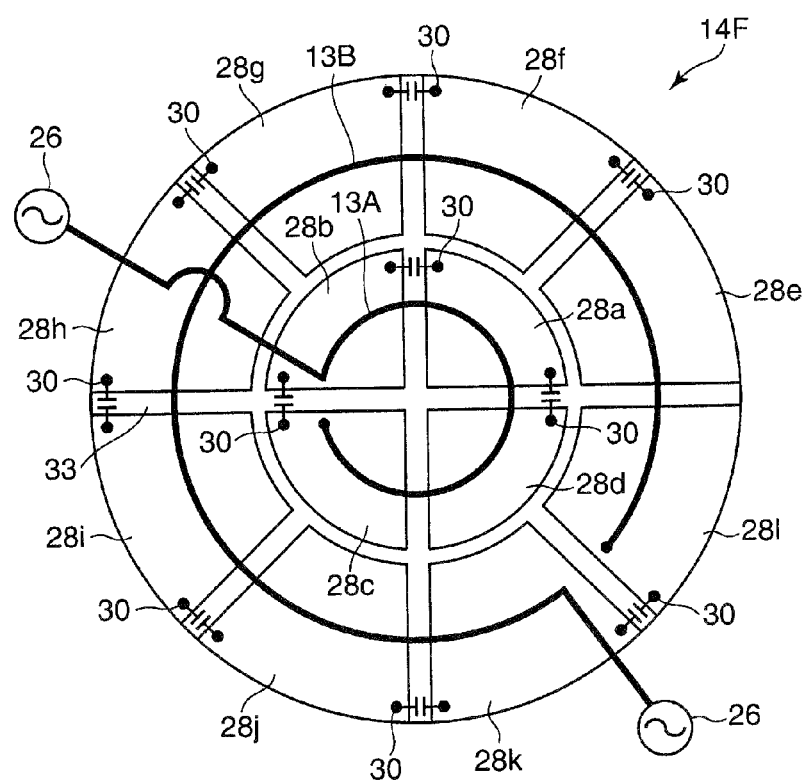
FIG. 8 is a top view showing a structure of a window member in accordance with still another embodiment of the present invention.

FIG. 7 is a top view showing a structure of the window member 14E in accordance with still another embodiment of the present invention. In the window member 14E, the conductive windows 28d and 28e positioned at the terminal of the connection are respectively connected to earth via capacitors 40 as a conductor. FIG. 8 is a top view showing a structure of the window member 14F in accordance with still another embodiment of the present invention. In the window member 14F, the conductive windows 28d and 28e positioned at the terminal of the connection are in an electrically floating state.

In the window members 14E and 14F, the form of the earth connection of the terminal conductive windows 28d and 28e has been changed from that in the window member 14 shown in FIG. 2. Even though the terminal conductive windows 28d and 28e are connected to earth via a conductor or the terminal conductive windows 28d and 28e are in an electrically floating state, the same effect as the window member 14 can be obtained. Therefore, the direct earth connection, the earth connection via a conductor, and the electrical floating state without earth connection may be arbitrarily combined for the terminal conductive windows.

As described above, the present invention improves the plasma generating efficiency by using as a sub-antenna the conductive windows forming the window member. Such a technical idea derives a configuration in which a high frequency current is made to flow only through a plurality of conductive windows without providing an ICP antenna (coil), i.e., a configuration in which a plurality of conductive windows is used as a main antenna.

Figure 9:
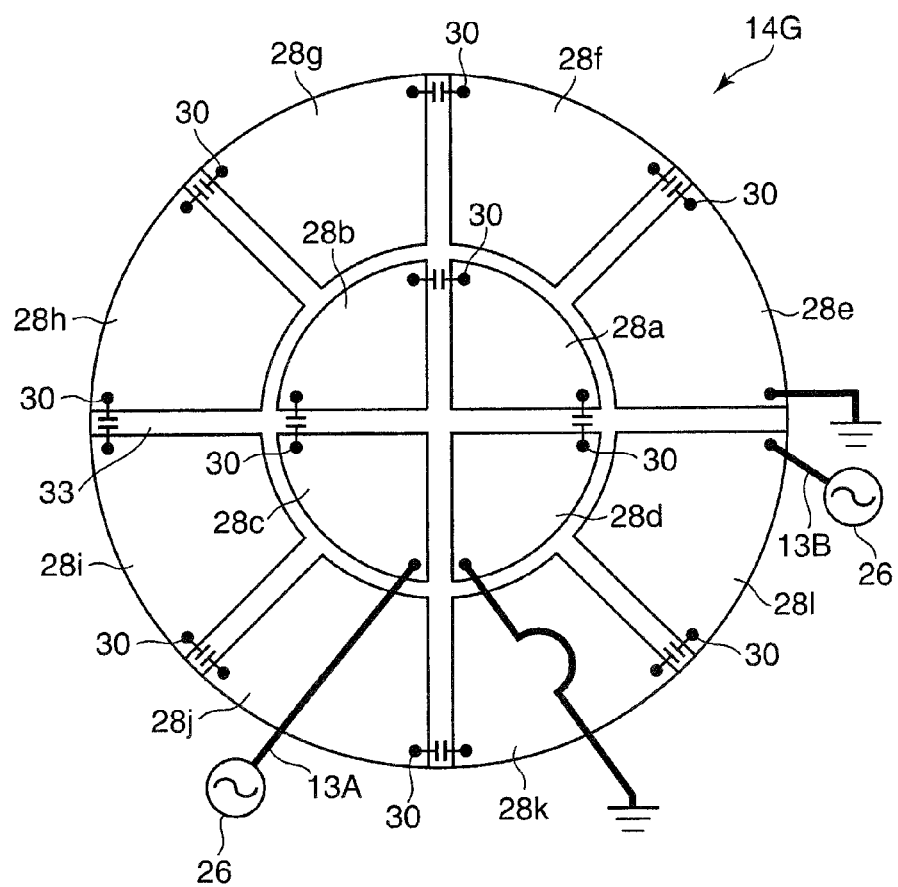
FIG. 9 is a top view showing a structure of a window member which uses a conductive window as an inductively coupled antenna.

FIG. 9 is a top view showing a structure of a window member 14G based on the above technical idea, which has been depicted from the same viewpoint as FIG. 2. In the case of using the window member 14G, as described with reference to FIG. 3B, the plasma generating efficiency deteriorates compared to the conventional configuration in which a high frequency current is made to flow only through the ICP antenna. However, in the case of using the window member 14G, there are the advantages of simplifying the configuration of the plasma processing apparatus, and improving the plasma uniformity (the vertical fluctuation is smaller than other cases, as shown in FIG. 3B.) Therefore, the configuration of the window member 14G may be preferably used when a simpler apparatus or plasma uniformity is considered more important than the plasma generating efficiency.

In accordance with the embodiments of the present invention, the window member disposed between the inductively coupled antenna and the space where a plasma is generated includes a plurality of conductive windows made of a conductive material and dielectric portions disposed between the conductive windows. Further, the inductively coupled antenna is extended in a predetermined direction on the window member and is electrically connected to one of the conductive windows, and electrical connection by a conductor is sequentially performed from the conductive window electrically connected to the inductively coupled antenna to the other conductive windows in the same direction as the extension direction of the inductively coupled antenna. Furthermore, a high frequency current is made to flow through the inductively coupled antenna and the conductive windows, thereby generating a plasma. Accordingly, the conductive windows serve as a sub-antenna, and the plasma generating efficiency can be improved. As a result, the throughput of the plasma processing can be improved.

While the invention has been shown and described with respect to the embodiments, it will be understood by those skilled in the art that various changes and modifications may be made without departing from the scope of the invention as defined in the following claims.

What is claimed is:

1. A plasma processing apparatus comprising:
   a processing chamber configured to accommodate therein a substrate;
   a mounting table, disposed in the processing chamber, configured to mount thereon the substrate;
   an inductively coupled antenna disposed outside the processing chamber to be opposite to the mounting table, the inductively coupled antenna being connected to a high frequency power supply; and
   a window member disposed between the mounting table and the inductively coupled antenna, the window member forming a wall of the processing chamber which faces the inductively coupled antenna,
   wherein the window member includes a plurality of conductive windows made of a conductive material, and dielectric portions disposed between the conductive windows; and
   the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

2. The plasma processing apparatus of claim 1, wherein the final one among the conductive windows electrically connected by the conductors is connected to earth via the conductor, or directly connected to earth without the conductor, or in an electrically floating state.

3. The plasma processing apparatus of claim 1, wherein the inductively coupled antenna is extended on the window member to form a circular arc about a center of the window member.

4. The plasma processing apparatus of claim 1, wherein the conductive windows are symmetrically arranged with respect to a center of the window member.

5. The plasma processing apparatus of claim 1, wherein the conductors are symmetrically arranged with respect to a center of the window member.

6. The plasma processing apparatus of claim 1, wherein the conductors are a metal wire, a metal board, or a conducting wire formed by arranging a capacitor between metal wires.

7. The plasma processing apparatus of claim 1, wherein the positions of the conductors are adjusted in accordance with plasma distribution in the processing chamber.

8. A plasma generating apparatus for generating a plasma in a depressurized chamber, comprising:
   an inductively coupled antenna disposed outside the depressurized chamber, the inductively coupled antenna being connected to a high frequency power supply; and
   a window member disposed between the inductively coupled antenna and a plasma generated in the depressurized chamber, the window member forming a wall of the depressurized chamber,
   wherein the window member includes a plurality of conductive windows made of a conductive material, and dielectric portions disposed between the conductive windows; and
   the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

9. The plasma generating apparatus of claim 8, wherein the final one among the conductive windows electrically connected by the conductors is connected to earth via the conductor, or directly connected to earth without the conductor, or in an electrically floating state.

10. The plasma generating apparatus of claim 8, wherein the conductors are a metal wire, a metal board, or a conducting wire formed by arranging a capacitor between metal wires.

11. The plasma generating apparatus of claim 8, wherein the positions of the conductors are adjusted in accordance with plasma distribution in the processing chamber.

12. An antenna structure comprising:
   an inductively coupled antenna to be connected to a high frequency power supply; and
   a window member disposed between the inductively coupled antenna and a plasma generated by the inductively coupled antenna, wherein the window member includes a plurality of conductive windows made of a conductive material, and dielectric portions disposed between the conductive windows, and the inductively coupled antenna is extended in a predetermined direction on the window member and electrically connected to one of the conductive windows, and electrical connection by conductors is sequentially performed from the one of the conductive windows to the other conductive windows in the same direction as an extension direction of the inductively coupled antenna.

13. The antenna structure of claim 12, wherein the final one among the conductive windows electrically connected by the conductors is connected to earth via the conductor, or directly connected to earth without the conductor, or in an electrically floating state.

14. The antenna structure of claim 12, wherein the conductors are a metal wire, a metal board, or a conducting wire formed by arranging a capacitor between metal wires.

15. The antenna structure of claim 12, wherein the positions of the conductors are adjusted in accordance with plasma distribution in the processing chamber.

16. A plasma generating method using an antenna structure including an inductively coupled antenna connected to a high frequency power supply, and a window member provided between the inductively coupled antenna and a plasma generated by the inductively coupled antenna, wherein the window member has a plurality of conductive windows made of a conductive material and dielectric portions disposed between the conductive windows, the method comprising:

extending the inductively coupled antenna on the window member in a predetermined direction and electrically connecting the inductively coupled antenna to one of the conductive windows;

electrically connecting from the one of the conductive windows to the other conductive windows sequentially by conductors in the same direction as an extension direction of the inductively coupled antenna; and generating a plasma by making a high frequency current flow through the inductively coupled antenna and the conductive windows.

17. The plasma generating method of claim 16, wherein the final one among the conductive windows electrically connected by the conductors is connected to earth via the conductor, or directly connected to earth without the conductor, or in an electrically floating state.

18. The plasma generating method of claim 16, wherein the conductors are a metal wire, a metal board, or a conducting wire formed by arranging a capacitor between metal wires.

19. The plasma generating method of claim 16, wherein the positions of the conductors are adjusted in accordance with plasma distribution in the processing chamber.

* * * * *